United States Patent
Park

(10) Patent No.: US 7,609,548 B2
(45) Date of Patent: Oct. 27, 2009

(54) METHOD OF PROGRAMMING A MULTI LEVEL CELL

(75) Inventor: Seong Je Park, Sacheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 67 days.

(21) Appl. No.: 11/858,907

(22) Filed: Sep. 21, 2007

(65) Prior Publication Data

US 2008/0080237 A1  Apr. 3, 2008

(30) Foreign Application Priority Data

Sep. 29, 2006  (KR) .............. 10-2006-0095969
Jun. 4, 2007  (KR) .............. 10-2007-0054385

(51) Int. Cl.
*G11C 16/04* (2006.01)

(52) U.S. Cl. .............. 365/185.03; 365/185.18; 365/185.22

(58) Field of Classification Search ........... 365/185.03, 365/185.11, 185.28, 185.16, 185.08, 185.24, 365/185.18, 185.22
See application file for complete search history.

(56) References Cited

U.S. PATENT DOCUMENTS

| | | | | |
|---|---|---|---|---|
| 5,930,172 A | * | 7/1999 | Kucera | 365/185.21 |
| 6,958,934 B2 | * | 10/2005 | Fan et al. | 365/185.03 |
| 7,221,598 B2 | * | 5/2007 | Jeong | 365/185.28 |
| 7,366,013 B2 | * | 4/2008 | Roohparvar | 365/185.03 |
| 7,366,014 B2 | * | 4/2008 | Micheloni et al. | 365/185.03 |
| 2008/0084739 A1 | * | 4/2008 | Chae et al. | 365/185.03 |
| 2008/0089123 A1 | * | 4/2008 | Chae et al. | 365/185.03 |

FOREIGN PATENT DOCUMENTS

| | | |
|---|---|---|
| JP | 11-110985 | 4/1999 |
| JP | 11-195299 | 7/1999 |
| KR | 1020050007653 A | 1/2005 |

* cited by examiner

*Primary Examiner*—Tuan T Nguyen
*Assistant Examiner*—Hien N Nguyen
(74) *Attorney, Agent, or Firm*—Townsend and Townsend and Crew LLP

(57) ABSTRACT

The present invention relates to a method of programming a multi level cell capable of storing above 1 data bit. The method includes storing first data in a first storing unit, storing second data in a second storing unit, programming a least significant bit data in accordance with the data stored in the first and second storing units, and programming a most significant bit data in accordance with the data stored in the first and second storing units following the program of the least significant bit data.

9 Claims, 6 Drawing Sheets

METHOD OF PROGRAMMING A MULTI LEVEL CELL

CROSS-REFERENCE TO RELATED APPLICATIONS

This application claims priority from Korean Patent Application No. 2006-95969, filed on Sep. 29, 2006 and Korean Patent Application No. 2007-54385, filed on Jun. 4, 2007, the contents of which are incorporated herein by reference in its entirety.

BACKGROUND OF THE INVENTION

The present invention relates to a method of programming a memory device, and more particularly to a method of programming a multi level cell (hereinafter, referred to as "MLC") capable of storing data above 2 bits.

Generally, a flash memory device is divided into a NAND flash memory and a NOR flash memory. In the NOR flash memory, each of the memory cells is connected independently to a bit line and a word line, and so the NOR flash memory has excellent random access time. Whereas, in the NAND flash memory, only one contact is required for one cell string because memory cells are connected in series, and so the NAND flash memory has excellent characteristics for integration. Accordingly, the NAND flash memory has been generally employed in high density flash memory.

A well-known NAND flash memory includes a memory cell array, a column decoder, and a page buffer. The memory cell array consists of a plurality of word lines extended along columns, a plurality of bit lines extended along rows and a plurality of cell strings corresponding to the bit lines.

Recently, multi bit cells for storing a plurality of data bits in one memory cell has been actively studied so as to enhance the degree of integration of the above flash memory. This memory cell is referred to as a multi level cell (hereinafter, referred to as "MLC"). A memory cell for storing one data bit is referred to as a single level cell (SLC).

The MLC has at least two threshold voltage distributions, and has at least two stored data states corresponding to the threshold voltage distributions.

Hereinafter, a method of programming data into the MLC will be described in detail.

FIG. 1 is a view illustrating a method of programming a common MLC.

Referring to FIG. 1, a MLC memory cell capable of storing 2 data bits has four data storage states, i.e. [11], [10], [00], and [01]. The distribution of the four data storage states corresponds to the threshold voltage distribution of the MLC. For example, [11] corresponds to the voltage of no more than −2.7V, [10] corresponds to the voltage of 0.3V to 0.7V, [00] corresponds to the voltage of 1.3V to 1.7V, and [01] corresponds to the voltage of 2.3V to 2.7V.

As shown in FIG. 1, a method of storing data in the MLC programs a most significant bit (hereinafter, referred to as "MSB") and a least significant bit (hereinafter, referred to as "LSB") of 2 data bits, respectively.

In step S1, the initial MLC state corresponds to [11], this is the erased state and has a threshold voltage of less than −2.7V. The LSB can then be programmed from '1' to '0', which would have a threshold voltage of 0.3V~0.7V.

In programming the MSB, the threshold voltage is increased to 1.3V~1.7V as shown in step of S2-1 for data information [00], and the threshold voltage is increased to 2.3V~2.7V as shown in step of S2-2 for data information [01].

The voltage applied to the MLC when programming data is increased in steps by an incremental step pulse programming (ISPP) method until the memory cell has the desired threshold voltage. Accordingly, the MLC programs the LSB in a first step, and then programs the MSB in a second step.

FIG. 2 is a timing diagram illustrating a programming process based on FIG. 1.

Referring to FIG. 2, a program command PGM COM, an address [Address Input] of a cell to be programmed, data [Data In] to be programmed and a command PGM COM for finishing the program are inputted in a command operation 10 for the program of the LSB.

In the case that the command operation input is finished, a control signal PBPAD of a page buffer is converted from high to low, and the program operation of the LSB is carried out by operation of an internal operation.

When the program operation of the LSB is finished, the steps are repeated for the operation 20 of the MSB.

However, the above method of programming the LSB and the MSB in two steps causes the MLC to be slower than the SLC.

SUMMARY OF THE INVENTION

It is a feature of the present invention to provide a method of programming a multi level cell, which programs the LSB and MSB, in one program operation instead of two.

A method of programming a multi level cell according to one example embodiment of the present invention includes storing first data in a first storing unit; storing second data in a second storing unit; programming a least significant bit data in accordance with the data stored in the first and second storing units; and programming a most significant bit data in accordance with the data stored in the first and second storing units following the program of the least significant bit data.

The first storing unit and the second storing unit are a first latch section and a second latch section in a page buffer for program operation of the multi level cell.

The method of claim 1 further includes verifying the program operation of the least significant bit data after programming the least significant bit data.

A threshold voltage value of the programmed multi level cell is increased from a first threshold voltage value to a second threshold voltage value, a third threshold voltage value or a fourth threshold voltage, wherein the first threshold voltage value<the second threshold voltage level<the third threshold voltage value<the fourth threshold voltage value.

The multi level cell having the first threshold voltage value corresponds to data state [11]; the multi level cell having the second threshold voltage value corresponds to data state [10]; the multi level cell having the third threshold voltage value corresponds to data state [00]; and the multi level cell having the fourth threshold voltage value corresponds to data state [01].

A method of programming a multi level cell, the method according to another example embodiment of the present invention includes storing first to nth data in a first to nth storing units; and programming the data stored in the storing units into a first to mth program states at one time.

A method of programming a multi level cell, the method according to still another example embodiment of the present invention includes storing a first data in a first storing unit; transmitting the first data stored in the first storing unit to a second storing unit; storing a second data in a second storing unit; determining data of a third storing unit in accordance with combination of the data in the first storing unit and the data in the second storing unit; and programming a least significant bit data and a most significant bit data at one time in accordance with the data in the first to third storing units.

The method of claim 7 further includes performing a verifying operation after the program operation, wherein the verifying operation about the most significant data bit and the least significant bit data is performed at one time in accordance with combination of the data in the first to third storing units.

The memory cell is programmed to a cell having a first threshold voltage distribution, a cell having a second threshold voltage distribution and a cell having a third threshold voltage distribution.

A method of programming a multi level cell according to still another example embodiment of the present invention includes receiving a program operation about a first bit; receiving a program operation about a second bit; and programming the first bit and the second bit at one time in accordance with the program operations.

As described above, a method of programming MLC inputs program commands related to every bit at one time and then programs the MLC through one program operation. As a result, a program time of the MLC may be reduced.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 1:
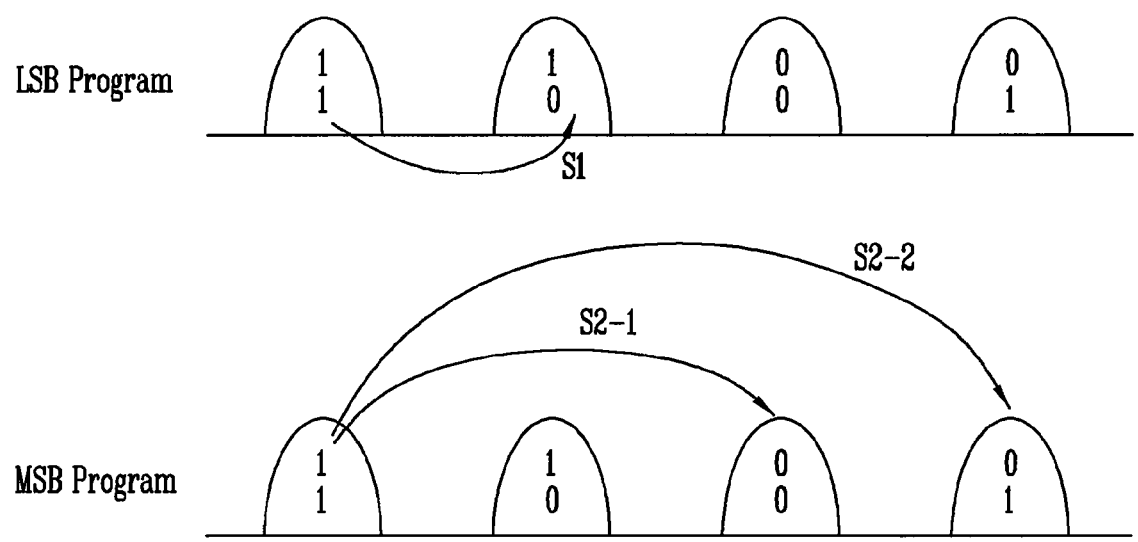
FIG. 1 is a view illustrating a method of programming a common MLC.
Figure 2:
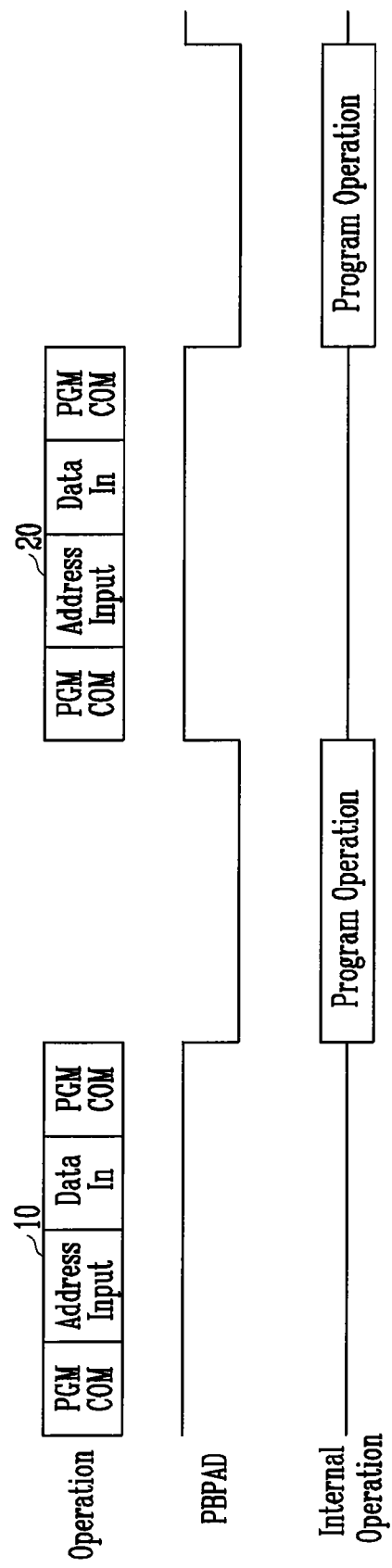
FIG. 2 is a timing diagram illustrating a programming process based on FIG. 1.
Figure 3:
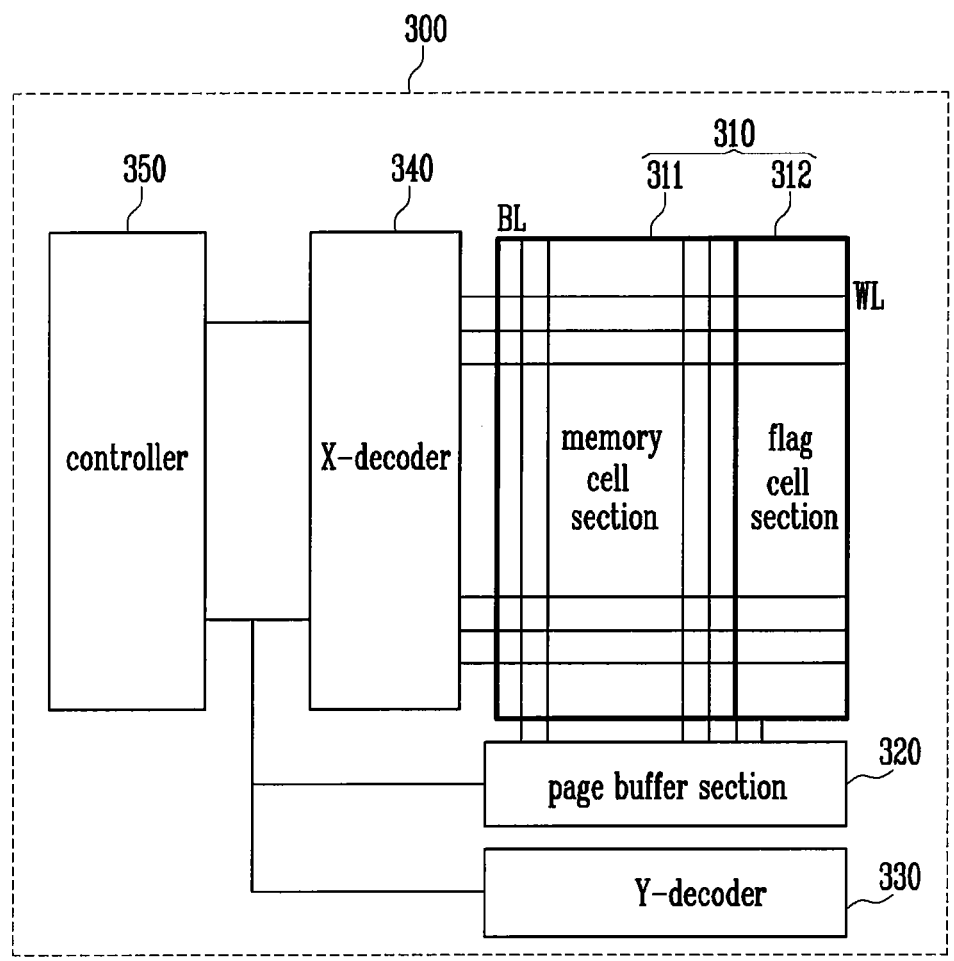
FIG. 3 is a block diagram illustrating a memory device having a multi level cell according to one example embodiment of the present invention.

FIG. 3 is a block diagram illustrating a memory device having a multi level cell according to one example embodiment of the present invention.

In FIG. 3, the memory device 300 includes a memory cell array 310, a page buffer section 320, a Y decoder 330, an X decoder 340 and a controller 350.

The memory cell array 310 includes a memory cell section 311 having a multi level cell (hereinafter, referred to as "MLC") for storing a plurality of data bits and a flag cell section 312.

Generally, the flag cell section 312 is made up of a single level cell (hereinafter, referred to as "SLC").

The memory cell section 311 has a bit line BL and a word line WL.

The flag cell section 312 has flag cells for indicating a program state of the word line WL of the memory cell section 311. Here, the flag cells are programmed or erased to indicate a program state of a logical page of the word line WL.

A pair of bit lines of the memory cell array 310 is coupled to a page buffer.

The page buffer programs data into the memory cell section 311, or reads programmed data from the memory cell section 311. The page buffer section 320 includes these page buffers.

The Y decoder 330 provides an input/output path of data to the page buffer section 320 for input/output of data in the memory device.

The X decoder 340 selects one of the word lines WL in the memory cell array 310 in accordance with an input address.

The controller 350 controls a program operation, a read operation and a verifying operation of the memory device.

Hereinafter, an operation of programming the MLC according to one example embodiment of the present invention will be described in detail.

Figure 4:
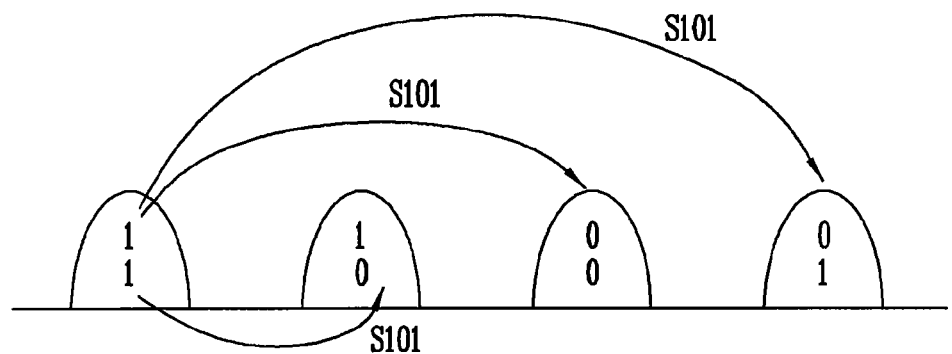
FIG. 4 is a view illustrating a method of programming the MLC according to one example embodiment of the present invention.

FIG. 4 is a view illustrating a method of programming the MLC according to one example embodiment of the present invention.

Referring to FIG. 4, in step S401, the method of programming the MLC for storing two data bits programs a least significant bit LSB and a most significant bit MSB at one time.

Figure 5:
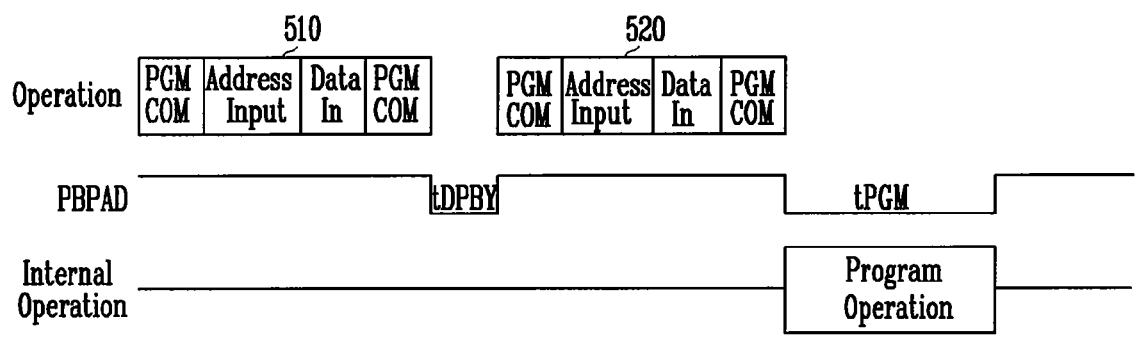
FIG. 5 is a timing diagram illustrating a programming process based on FIG. 4.

FIG. 5 is a timing diagram illustrating a programming process based on FIG. 4.

Referring to FIG. 5, a LSB program operation 510 is inputted and then the MSB program operation 520 is inputted after a predetermined period of time tDPBY from the input of the LSB program operation 510.

The predetermined period of time tDPBY is a short period for separating the operations when the LSB program operation 510 and the MSB program operation 520 are inputted.

A process of programming the MLC using the inputted operations 510 and 520 is varied depending on an operation of the page buffer.

In case that the page buffer has two latches, the LSB data and the MSB data are latched and then a LSB page and a MSB page are programmed in sequence.

That is, the method of programming the MLC of the present embodiment receives the LSB operation 510 and the MSB operation 520 in sequence at one time, and then programs the LSB and the MSB at one time in accordance with the received operations 510 and 520. In this case, a certain voltage for the data program is provided to the MLC by using an incremental step pulse programming (hereinafter, referred to as "ISPP") method.

However, in case that the page buffer has three latches, state of data to be programmed is loaded in the latches and then the MSB page and the LSB page are programmed at one time.

In other words, when storing two data bits, an erased cell has data state [11] and should be changed to data states [10], [01], [00] through a program operation. Hence, data states [10], [01], [00] are respectively assigned to the three latches and then are programmed at one time. As a result, the LSB page and the MSB page are programmed at one time.

Hereinafter, the operation of the page buffer in a memory device of the present invention will be described in detail.

Figure 6:
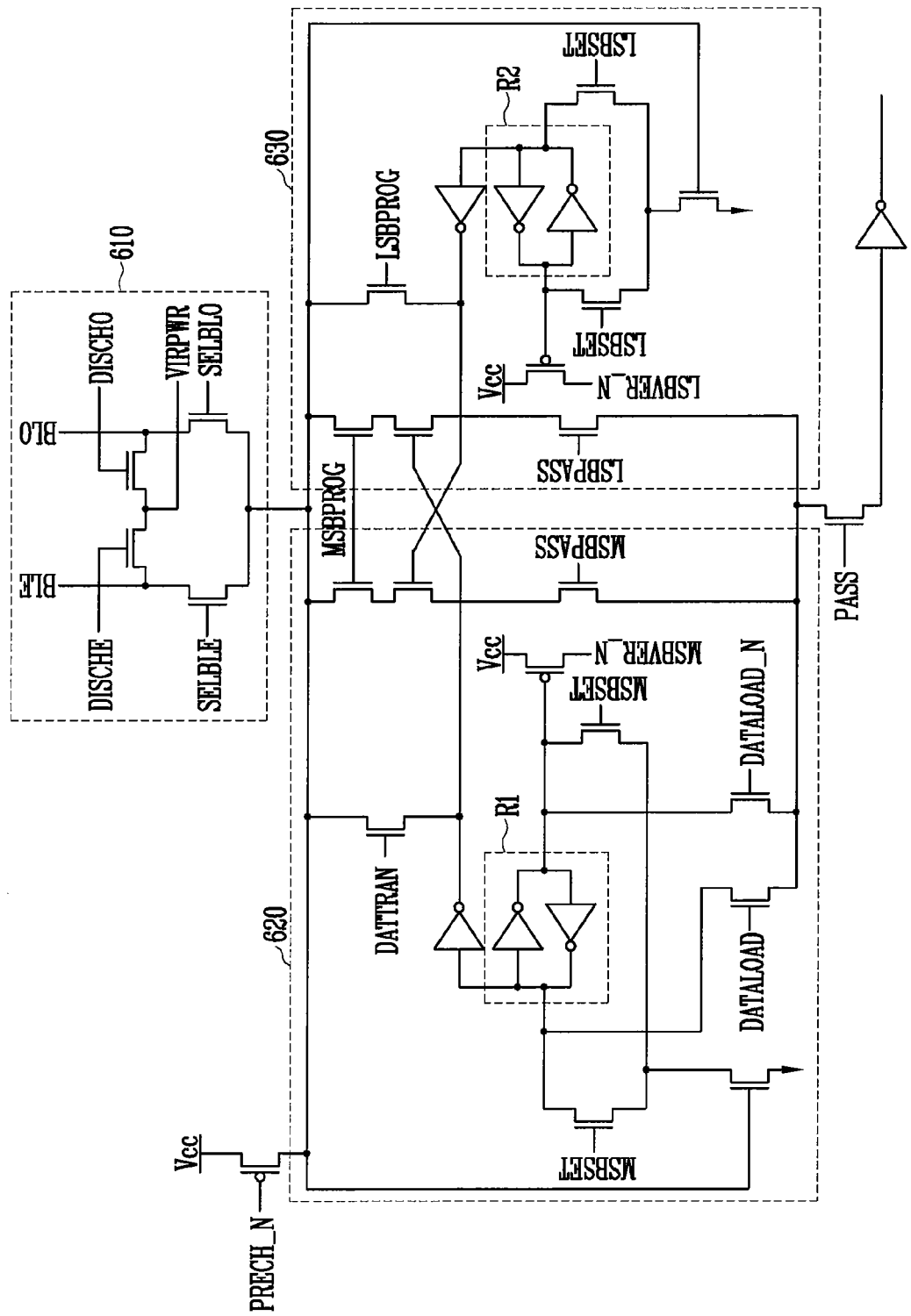
FIG. 6 is a view illustrating the circuitry of the page buffer for the MLC program according to a first embodiment of the present invention.

FIG. 6 is a view illustrating the circuitry of the page buffer for the MLC program according to a first embodiment of the present invention.

Referring to FIG. 6, the page buffer of the memory device having a MLC (not shown) capable of storing data above 1 bit includes a bit line selecting section 610 for selecting a bit line, a MSB latch section 620 and a LSB latch section 630 for programming data in the MLC or reading data from the MLC.

The bit line selecting section 610 couples bit line even (hereinafter, referred to as "BLE") or bit line odd (hereinafter, referred to as "BLO") to the latch section 620 or 630 so that data is programmed into a memory cell corresponding to a selected bit line of the bit lines or data are read from the memory cell.

The MSB latch 620 and the LSB latch 630 include latches R1 and R2 for temporarily storing data when programming or reading data, N-MOS transistors, P-MOS transistors and inverters.

As mentioned above, the MSB latch section 620 and the LSB latch section 630 are included in the page buffer coupled to a pair of bit lines. Here, since the page buffer is well-known, a detailed description concerning the page buffer will be omitted.

Hereinafter, the operation of the page buffer for programming data in the MLC or reading data from the MLC in the Related Art will be described.

Firstly, LSB data and a program command are inputted through an outside operation so as to store LSB data in the MLC.

Subsequently, the inputted LSB data are inputted to the MSB latch section 620, and then are temporarily stored in the latch R1.

Then, the data stored temporarily in the latch R1 are stored in a selected MLC in accordance with a usual program method of a memory cell.

Subsequently, MSB data and a program command are inputted through the outside operation in order to input the MSB data to the MLC.

Then, the inputted MSB data are inputted to the MSB latch section 620, and then are temporarily stored in the latch R1.

Subsequently, the LSB latch section 630 reads the LSB data from the MLC, and then temporarily stores the read data in the latch R2.

Then, the MSB latch section 620 and the LSB latch section 630 compares data stored in the latches R1 and R2, and performs the MSB program in accordance with the comparison result.

The method described above is a common method of programming the MLC using the page buffer having two latches as shown in FIG. 6.

Hereinafter, the method of programming the MLC according to one example embodiment of the present invention will be described in detail.

Firstly, the LSB data and a first program command are inputted through an outside operation, and then after a predetermined period of time tDPBY the MSB data and a second program command are inputted.

The inputted LSB data are temporarily stored in the latch R2 of the LSB latch section 630, and the MSB data are temporarily stored in the latch R1 of the MSB latch section 620.

The program of MLC is performed under the condition of storing the MSB data and the LSB data in the latches R1 and R2 of the latch sections 620 and 630.

Hereinafter, a method of programming the MLC using the page buffer in FIG. 6 according to a first example embodiment will be described in detail.

Firstly, the LSB data stored in the LSB latch section 630 are stored in the MLC through a selected bit line of the bit lines.

Subsequently, the LSB latch section 630 performs the program operation of the LSB data, and read the LSB data after finishing the program operation.

Then, the LSB latch section 630 verifies the read LSB data, and stores again the read LSB data in the latch R2 in case that it is verified that the program operation is normally performed.

Subsequently, the MSB data stored in the latch R1 of the MSB latch section 620 and the LSB data stored in the latch R2 of the LSB latch section 630 are compared, and then performs the program operation of the MSB data. Here, since a method of storing the MSB data in the present invention is the same as in the Related Art, a description concerning the method of storing data of the present invention will be omitted.

In brief, the memory device programs the LSB data and the MSB data inputted in sequence at one time, and so the programming time for the LSB data and the MSB data may be reduced.

In another embodiment, a method of programming the MLC may use below page buffer.

Figure 7:
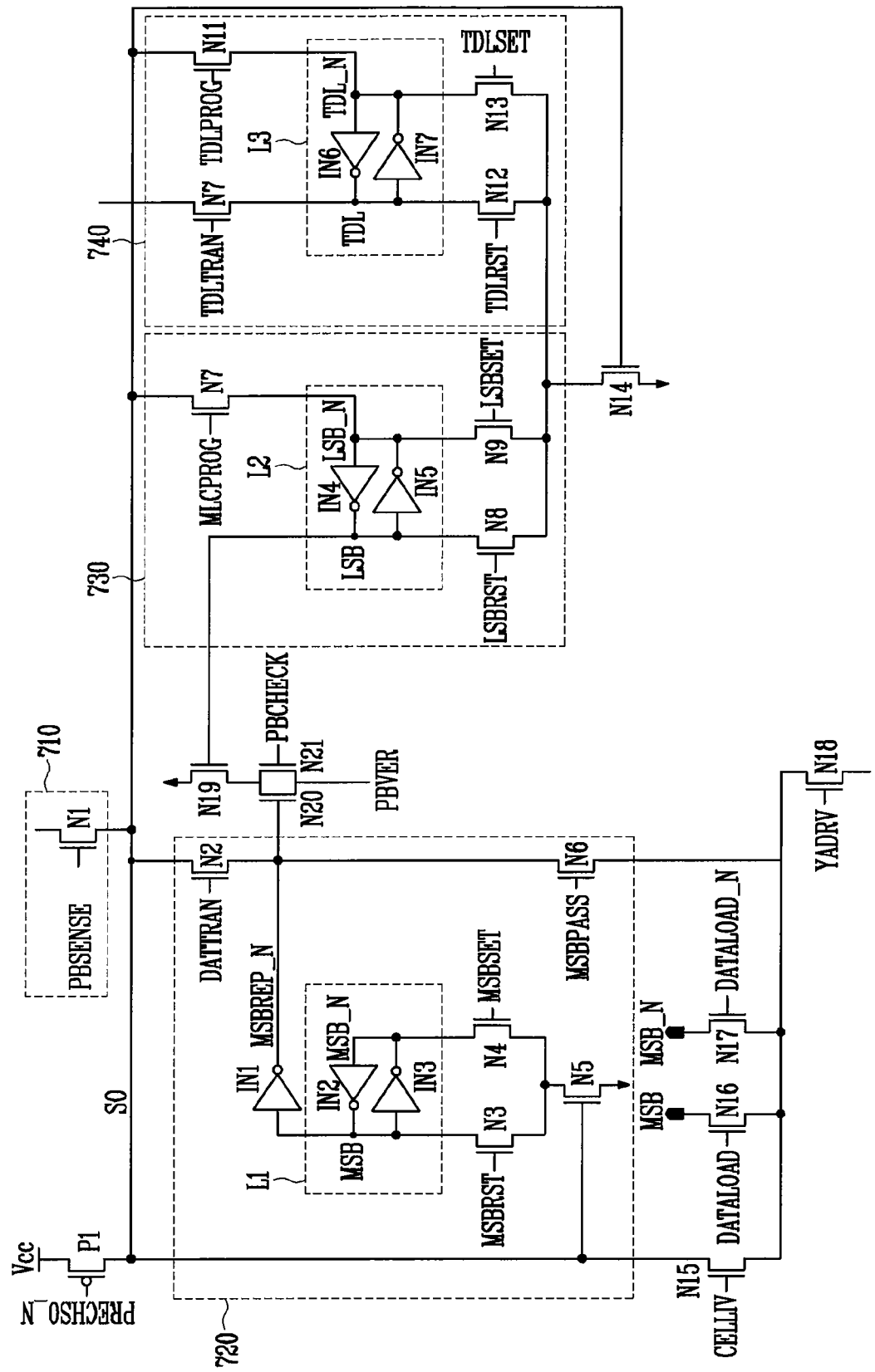
FIG. 7 is a view illustrating a circuitry of a page buffer for a MLC program operation according to a second embodiment of the present invention.

FIG. 7 is a view illustrating a circuitry of a page buffer for a MLC program operation according to a second embodiment of the present invention.

Referring to FIG. 7, the page buffer of the present embodiment includes a bit line selecting section 710, a first to third latch sections 720 to 740, a first P-MOS transistor P1, and a fifteenth to twenty first N-MOS transistors N15 to N21.

The bit line selecting section 710 couples a bit line even BLE or a bit line odd BLO to the latch sections 720 to 740 so that data are programmed in a memory cell corresponding to a selected bit line of the bit lines or data are read from the memory cell.

On the other hand, FIG. 7 shows only a first N-MOS transistor N1 as a transistor coupled to the selected bit line.

The first to third latch sections 720 to 740 have latches L1 to L3 for temporarily storing data when programming or reading data, a plurality of N-MOS transistors and an inverter.

The first latch section 720 includes a second to sixth N-MOS transistors N2 to N6 and a first to third inverters IN1 to IN3.

The second latch section 730 has a seventh to ninth N-MOS transistors N7 to N9, a fourth inverter IN4 and a fifth inverter IN5.

The third latch section 740 includes a tenth to thirteenth N-MOS transistors N10 to N13, a sixth inverter IN6 and a seventh inverter IN7.

The first P-MOS transistor P1 precharges a sensing node SO in accordance with a precharge signal PRECHSO_N.

The sixteenth and seventeenth N-MOS transistors N16 and N17 are respectively coupled to a node MSB and a node MSB_N of the first latch section 720 so that data inputted from outside circuit are temporarily stored in the first latch L1.

The nineteenth to twenty first N-MOS transistors N19 to N21 output a verifying signal in accordance with a program verifying result of data stored in the latch sections 720 to 740.

The verifying signal is inputted to the controller 350 in the NAND flash memory having the page buffer of the second embodiment.

States of the first to third latches L1 to L3 are changed as shown in below Table 1 so as to program the MLC using the page buffer of the second embodiment.

TABLE 1

| Operation | MSB_N | | | | LSB_N | | | | TDL_N | | | | Signal |
|---|---|---|---|---|---|---|---|---|---|---|---|---|---|
| | 1 | 2 | 3 | 4 | 1 | 2 | 3 | 4 | 1 | 2 | 3 | 4 | |
| Reset MSB | 1 | 1 | 1 | 1 | — | — | — | — | — | — | — | — | PRECHSO_N, MSBRST(CI) |
| DATA IN | 1 | 0 | 1 | 0 | — | — | — | — | — | — | — | — | DATALOAD, DATALOAD_N |
| IR_T_M2T | 1 | 0 | 1 | 0 | — | — | — | — | 1 | 0 | 1 | 0 | TDLSET, PRECHSO_N, DATTRAN, TDLRST |
| DATA IN  FLAG = 1 | 1 | 1 | 0 | 0 | — | — | — | — | 1 | 0 | 1 | 0 | MSBSET, PRECHSO_N, MLCPROG, MSBRST |
| IR_T_M2L FLAG = 1 | 1 | 1 | 0 | 0 | 1 | 1 | 0 | 0 | 1 | 0 | 1 | 0 | LSBSET, PRECHSO_N, DATTRAN, LSBRST |
| L_T_L_T2L FLAG = 1 | 1 | 1 | 0 | 0 | 1 | 0 | 0 | 0 | 1 | 0 | 1 | 0 | PRECHSO_N, TDLTRAN, LSBSET |

Hereinafter, a process of programming the MLC will be described in detail with reference to the Table 1 and FIG. 7.

Firstly, the precharge signal PRECHSO_N and a MSBRST signal are provided to the page buffer, thereby initializing the node MSB_N of the first latch L1 to high level 1.

Data input signals DATALOAD and DATALOAD_N are provided to the transistors N16 and N17 for input of the LSB data, thereby latching the LSB data to the node MSB_N in the first latch L1.

The data latched to the node MSB_N are transmitted to a node TDL_N in the third latch L3. In this case, a signal TDLSET, the precharge signal PRECHSO_N, a signal DATTRAN and a signal TDLRST are used for the program operation.

The MSB data are latched in the first latch L1 after the LSB data are transmitted to the third latch L3. In this case, a signal MSBSET, the precharge signal PRECHSO_N, a signal MLCPROG and a signal MSBRST are used for the program operation.

Subsequently, a flag cell of the flag cell section 312 is programmed to indicate the fact that the MSB data are latched in the first latch L1.

Data in the second latch L2 are determined by combination of the data latched in the first latch L1 and the data latched in the third latch L3. In this case, a signal LSBSET, the precharge signal PRECHSO_N, the signal DATTRAN, a signal LSBRST, and the signal TDLRAN are used for program operation.

That is, the LSB data and the MSB data to be programmed are stored in the first to third latches L1 to L3 through the above process, respectively.

The data stored in the first to third latches L1 to L3 are programmed at one time, and then the program operation is verified. In other words, data state [11] corresponding to the erased cell are programmed to data states [01], [00] and [10] at one time, and then the program operation is verified.

Particularly, in the Table 1, a node state [1111] means a state of an erased cell.

The node state [1111] is converted into a state [1100] or [1010].

In case that the state [1111] is converted into the state [1100], the data in the first latch L1 are programmed, and then the verifying operation is performed by using the control signal LSBRST of the second latch L2.

In case that the state [1111] is converted into the state [1010], the data of the node TDL_N in the third latch L3 are programmed, and then the verifying operation is performed by using the control signal LBSRST.

In case that the state [1111] is maintained, the program operation is not performed, but a verifying operation is performed by using the control signal LSBRST of the second latch L2.

As described above, the method of programming the MLC using the page buffer shown in FIG. 7 programs the data in the first and third latches L1 and L3, and verifies the program operation using the data stored in the second latch L2.

The method of programming the MLC latches the LSB data and the MSB data in the page buffer at one time, and then performs the program operation and the verifying operation.

In short, the method of programming the MLC is not limited to program two data bits but may program N (is integer above 2) data bits.

When the MLC having N data bits has M threshold voltage distributions, the page buffer includes N latch sections to latch N data bits at one time. That is, the method inputs and latches N data bits, and then programs every data bits at one time so that the MLC has M threshold voltage distributions.

In another embodiment (the second embodiment), the page buffer may include (N+1) latches, and then programs the MLC so that the MLC has M threshold voltage distributions.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment.

Although embodiments have been described with reference to a number of illustrative embodiments, it should be understood that numerous other modifications and embodiments can be devised by those skilled in the art that will fall within the spirit and scope of the principles of this disclosure. More particularly, numerous variations and modifications in the component parts and/or arrangements of the subject are possible within the scope of the disclosure, the drawings and the appended claims. In addition to variations and modifications in the component parts and/or arrangements, alternative uses will also be apparent to those skilled in the art.

What is claimed is:

1. A method of programming a multi level cell, the method comprising:
    storing first data in a first storing unit;
    storing second data in a second storing unit;
    programming a least significant bit data in accordance with the data stored in the first and second storing units, wherein the least significant bit is programmed after the second data is stored in the second storage unit; and
    programming a most significant bit data in accordance with the data stored in the first and second storing units following the program of the least significant bit data.

2. The method of claim 1, wherein the first storing unit and the second storing unit are a first latch section and a second latch section in a page buffer for program operation of the multi level cell.

3. The method of claim 1, wherein a threshold voltage value of the programmed multi level cell is increased from a first threshold voltage value to a second threshold voltage value, a third threshold voltage value or a fourth threshold voltage,
  wherein the first threshold voltage value is less than the second threshold voltage level, second threshold level is less than the third threshold voltage value, and the third threshold voltage level is less the fourth threshold voltage value.

4. The method of claim 3, wherein:
the multi level cell has the first threshold voltage value that corresponds to data state,
the multi level cell has the second threshold voltage value that corresponds to data state,
the multi level cell has the third threshold voltage value that corresponds to data state, and
the multi level cell has the fourth threshold voltage value that corresponds to data state.

5. A method of programming a multi level cell, the method comprising:
  storing a first data in a first storing unit;
  transmitting the first data stored in the first storing unit to a second storing unit;
  storing a second data in the first storing unit;
  determining data of a third storing unit in accordance with combination of the data in the first storing unit and the data in the second storing unit; and
  programming the multi level cell at one time in accordance with the data in the first to third storing units, wherein the multi level cell is programmed after determining the data of the third storing unit.

6. The method of claim 5, wherein the multi level cell is programmed to a cell having a first threshold voltage distribution, a cell having a second threshold voltage distribution and a cell having a third threshold voltage distribution.

7. A method of programming a multi level cell, the method comprising:
  receiving a first program information about a first bit;
  receiving a second program information about a second bit; and
  performing a programming operation after receiving the second program information.

8. The method of claim 7, wherein the programming operation comprises a programming operation of the first bit and a programming operation of the second bit.

9. The method of claim 7, wherein the multi level cell comprises a first verifying objection memory cell, a second verifying objection memory cell and a third verifying objection memory cell, the programming operation comprising:
  performing repeatedly a programming operation of the first verifying objection memory cell until the first verifying objection memory cell is programmed to a threshold voltage level that is higher than a first verifying voltage;
  performing repeatedly a programming operation of the second verifying objection memory cell until the second verifying objection memory cell is programmed to a threshold voltage level that is higher than a second verifying voltage; and
  performing repeatedly a programming operation of the third verifying objection memory cell until the third verifying objection memory cell is programmed to a threshold voltage level that is higher than a third verifying voltage.

* * * * *